United States Patent
Masuda et al.

(10) Patent No.: US 12,040,767 B2
(45) Date of Patent: Jul. 16, 2024

(54) LAMINATED LC FILTER

(71) Applicant: Murata Manufacturing Co., Ltd., Nagaokakyo (JP)

(72) Inventors: Hiroshi Masuda, Nagaokakyo (JP); Kunihiro Watanabe, Nagaokakyo (JP); Rumiko Yuasa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 264 days.

(21) Appl. No.: 17/665,627

(22) Filed: Feb. 7, 2022

(65) Prior Publication Data

US 2022/0158603 A1 May 19, 2022

Related U.S. Application Data

(63) Continuation of application No. PCT/JP2020/028869, filed on Jul. 28, 2020.

(30) Foreign Application Priority Data

Aug. 29, 2019 (JP) ................. 2019-157437

(51) Int. Cl.
| | |
|---|---|
| *H03H 7/01* | (2006.01) |
| *H01F 27/28* | (2006.01) |
| *H01F 27/40* | (2006.01) |
| *H01G 4/30* | (2006.01) |
| *H01G 4/40* | (2006.01) |

(Continued)

(52) U.S. Cl.
CPC ....... *H03H 7/0115* (2013.01); *H01F 27/2804* (2013.01); *H01F 27/40* (2013.01); *H01G 4/30* (2013.01); *H01G 4/40* (2013.01); *H05K 1/115* (2013.01); *H01F 2027/2809* (2013.01); *H03H 2001/0085* (2013.01)

(58) Field of Classification Search
CPC . H03H 2001/0085; H03H 7/0115; H03H 7/09
USPC ................................. 333/175, 185
See application file for complete search history.

(56) References Cited

U.S. PATENT DOCUMENTS

2002/0030561 A1* 3/2002 Masuda ............... H03H 7/1766
                                                      333/176
2015/0303890 A1 10/2015 Taniguchi

FOREIGN PATENT DOCUMENTS

JP       09-307389 A    11/1997
JP    2000-357932 A    12/2000
(Continued)

OTHER PUBLICATIONS

Official Communication issued in International Patent Application No. PCT/JP2020/028869, mailed on Sep. 24, 2020.

*Primary Examiner* — Rakesh B Patel
(74) *Attorney, Agent, or Firm* — Keating & Bennett, LLP (57) ABSTRACT

A multilayer substrate includes a via electrode defining and functioning as an end portion on ground terminals side of a first inductor connected to a shield electrode, the end portion on a signal line side is adjacent to or in a vicinity of a first principal surface than the end portion on the ground terminals side is in the lamination direction of base material layers, a via electrode defining and functioning as the end portion on the ground terminals side of a second inductor is connected to the shield electrode, and the end portion on the signal line side is adjacent to or in a vicinity of the first principal surface than the end portion on the ground terminals side is in the lamination direction of the base material layers.

11 Claims, 7 Drawing Sheets

(51) Int. Cl.
*H05K 1/11* (2006.01)
*H03H 1/00* (2006.01)

(56) References Cited

FOREIGN PATENT DOCUMENTS

| | | |
|---|---|---|
| JP | 2008-167157 A | 7/2008 |
| JP | 2010-178004 A | 8/2010 |
| WO | 2015/059964 A1 | 4/2015 |

* cited by examiner

LAMINATED LC FILTER

CROSS REFERENCE TO RELATED APPLICATIONS

This application claims the benefit of priority to Japanese Patent Application No. 2019-157437 filed on Aug. 29, 2019 and is a Continuation Application of PCT Application No. PCT/JP2020/028869 filed on Jul. 28, 2020. The entire contents of each application are hereby incorporated herein by reference.

BACKGROUND OF THE INVENTION

1. Field of the Invention

The present invention relates to a laminated LC filter including a multilayer substrate including inductors and capacitors provided therein.

2. Description of the Related Art

Japanese Unexamined Patent Application Publication No. 2008-167157 discloses a laminated LC filter. The laminated LC filter disclosed in Japanese Unexamined Patent Application Publication No. 2008-167157 is a high pass filter.

The laminated LC filter disclosed in Japanese Unexamined Patent Application Publication No. 2008-167157 includes a multilayer substrate including a plurality of laminated base material layers. A via electrode is formed through the base material layers. A line electrode and a capacitor electrode are formed between the base material layers. An inductor is formed by the via electrode and the line electrode. A capacitor is formed by the capacitor electrode.

In a laminated LC filter such as the one disclosed in Japanese Unexamined Patent Application Publication No. 2008-167157, to prevent the ingress of noise from the outside to the inside and the radiation of noise from the inside to the outside, a shield electrode needs to be provided between the layers of the multilayer substrate or on the principal surface thereof in some cases. Meanwhile, inside the multilayer substrate, a shunt inductor having one end connected to the signal line and the other end connected to the ground is provided in some cases.

Since the shield electrode is generally connected to the ground, when the signal line-side end portion of the shunt inductor and the shield electrode are close to each other inside the multilayer substrate, a large stray capacitance is generated between the signal line-side end portion and the shield electrode in some cases. This stray capacitance is formed in parallel to the shunt inductor, and thus there is a risk that if this stray capacitance is large, the pass band is narrowed and the return loss is increased.

SUMMARY OF THE INVENTION

Preferred embodiments of the present invention provide laminated LC filters that each prevent the generation of stray capacitance between the signal line-side end portion of an inductor and a shield electrode, thus preventing the pass band from being narrowed and reducing the return loss.

A laminated LC filter according to a preferred embodiment of the present invention includes a multilayer substrate that includes a plurality of laminated base material layers, a first principal surface, and a second principal surface, a via electrode extending through the base material layers, a line electrode and a capacitor electrode between the base material layers, and a first terminal, a second terminal, and a ground terminal on the first principal surface of the multilayer substrate. At least one of the via electrode and the line electrode defines an inductor. The capacitor electrode defines a capacitor. A signal line is between the first terminal and the second terminal. A third capacitor is connected in a central portion of the signal line. A first capacitor and a first inductor are connected in series in this order between the ground terminal and a point on the signal line between the first terminal and the third capacitor. A second capacitor and a second inductor are connected in series in this order between the ground terminal and a point on the signal line between the third capacitor and the second terminal. The laminated LC filter further includes a shield electrode between the base material layers adjacent to or in a vicinity of the second principal surface of the multilayer substrate or on the second principal surface of the multilayer substrate, and a third inductor between the shield electrode and the ground terminal. In the multilayer substrate, an end portion on the ground terminal side of the first inductor is connected to the shield electrode, an end portion on the signal line side of the first inductor is closer to the first principal surface than the end portion on the ground terminal side of the first inductor is in a lamination direction of the base material layers, an end portion on the ground terminal side of the second inductor is connected to the shield electrode, and an end portion on the signal line side of the second inductor is closer to the first principal surface than the end portion on the ground terminal side of the second inductor is in the lamination direction of the base material layers.

In each of the laminated LC filters according to preferred embodiments of the present invention, the stray capacitance generated between the signal line-side end portion of the first inductor and the shield electrode and the stray capacitance generated between the signal line-side end portion of the second inductor and the shield electrode are reduced so that the pass band is prevented from being narrowed and the return loss is reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be is described below with reference to the drawings.

Each preferred embodiment is an example of the present invention and the present invention is not limited to the details of the respective preferred embodiments. Further, the details described in the different preferred embodiments may be combined, and the details of the combined preferred embodiments are also included in the present invention. Further, the drawings are provided to aid the understanding of the specification and may schematically illustrate components, and the ratio of the dimensions of each illustrated component or the ratios of the dimensions between the components may not match the ratios of the dimensions described in the specification in some cases. Further, for example, some of the components described in the specification may be omitted or reduced in number in the drawings.

Figure 1A:
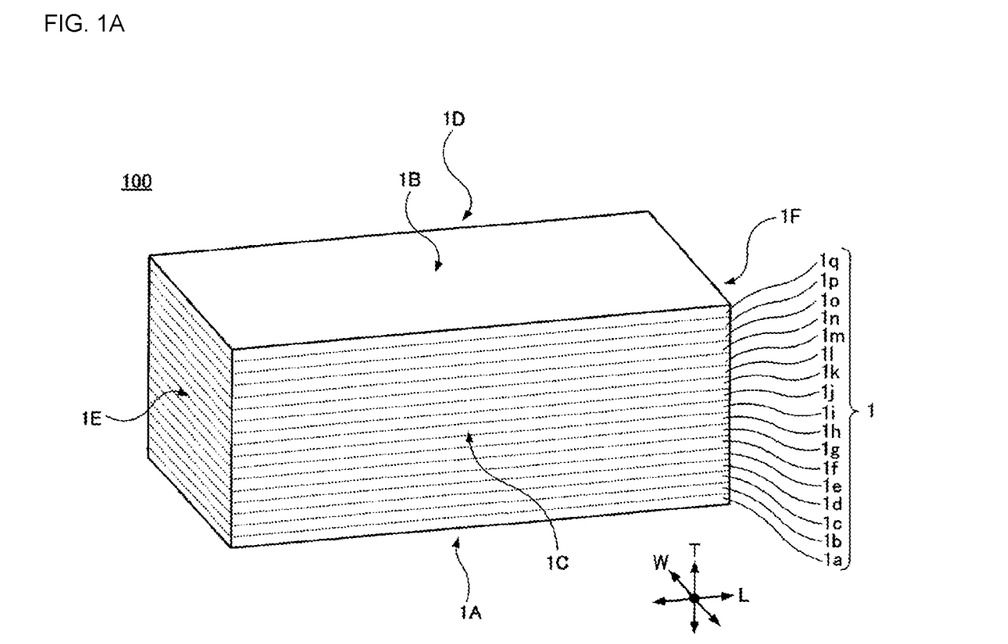
FIG. 1A is a perspective view of a laminated LC filter 100 according to a preferred embodiment of the present invention when viewed from a second principal surface side.
Figure 1B:
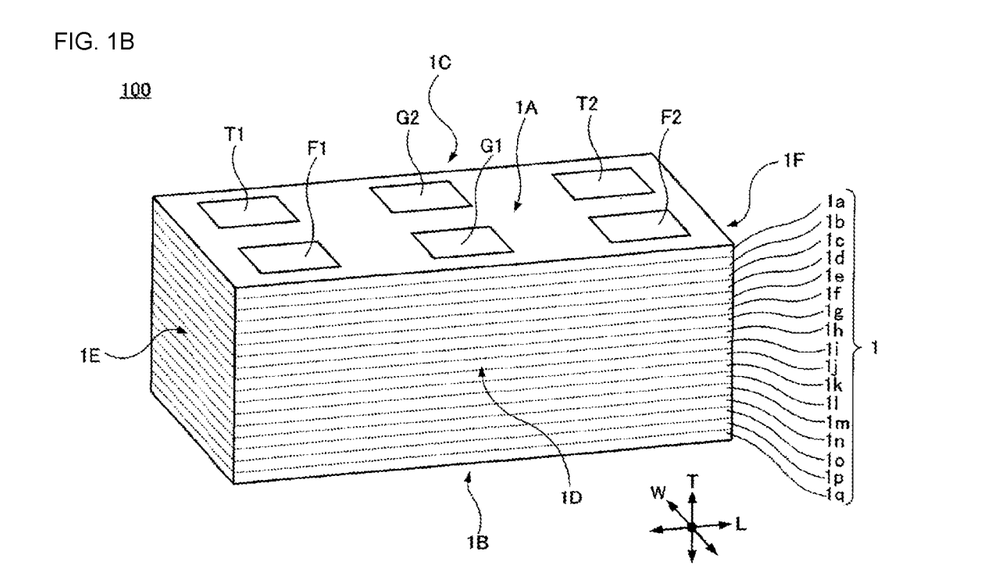
FIG. 1B is a perspective view of the laminated LC filter 100 when viewed from a first principal surface side.
Figure 2:
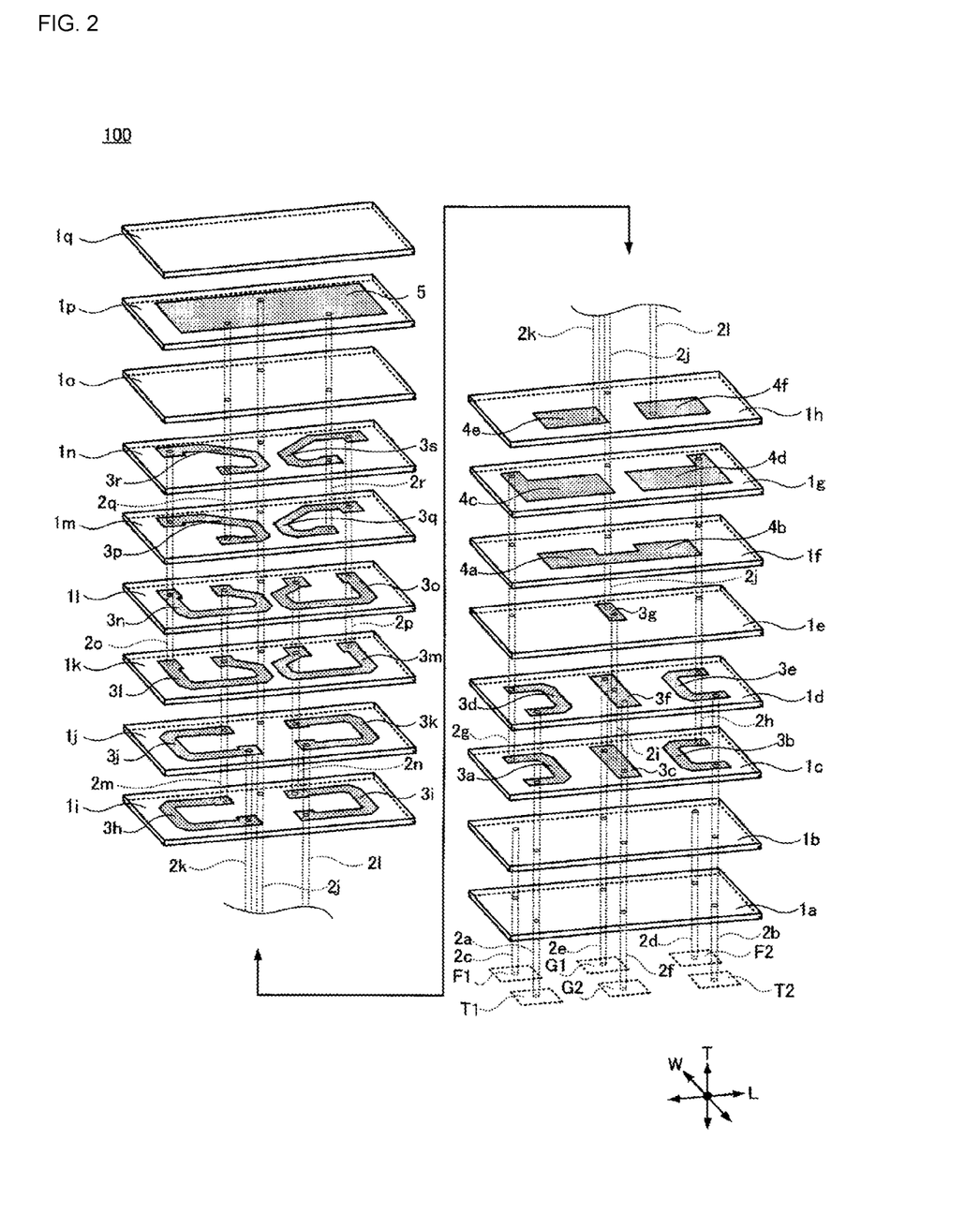
FIG. 2 is an exploded perspective view of the laminated LC filter 100.
Figure 3:
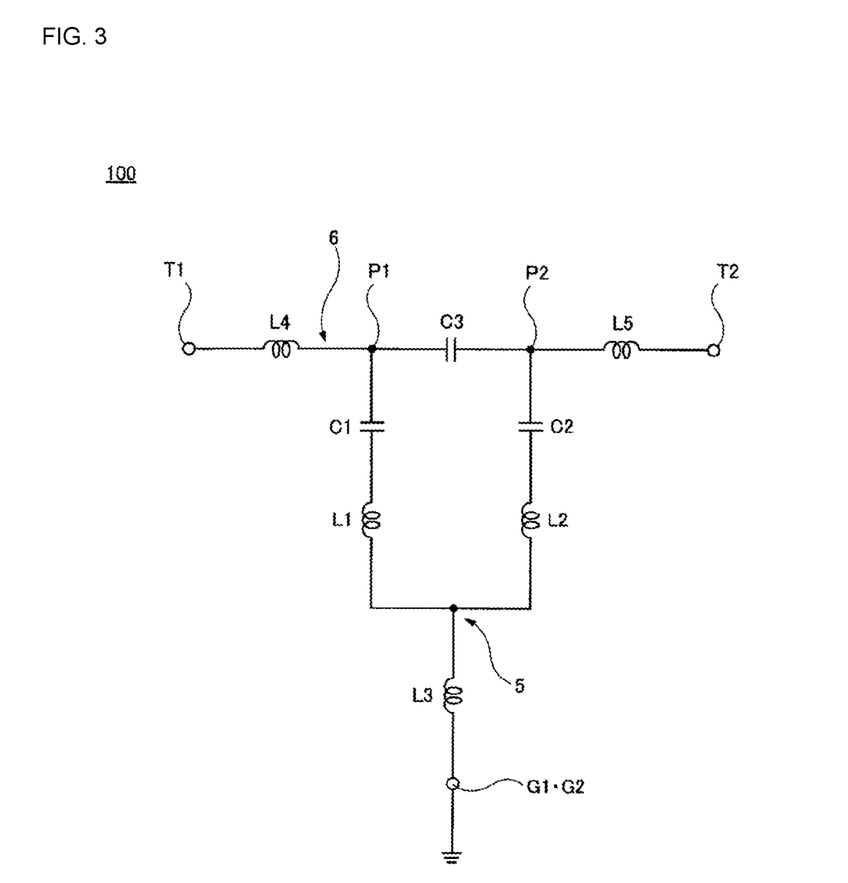
FIG. 3 is an equivalent circuit diagram of the laminated LC filter 100.

FIGS. 1A and 1B, FIG. 2, and FIG. 3 illustrate a laminated LC filter 100 according to a preferred embodiment of the present invention. Here, FIG. 1A is a perspective view of the laminated LC filter 100 when viewed from a second principal surface (upper principal surface) side. FIG. 1B is a perspective view of the laminated LC filter 100 when viewed from a first principal surface (lower principal surface) side. FIG. 2 is an exploded perspective view of the laminated LC filter 100. FIG. 3 is an equivalent circuit diagram of the laminated LC filter 100.

In FIGS. 1A and 1B, and FIG. 2, a height direction T, a length direction L, and a width direction W of the laminated LC filter 100 are indicated by the arrows, and in the following description, those directions may be referred to. The height direction T is the lamination direction of a multilayer substrate 1, which is described later. The length direction L is a direction in which a first terminal T1 and a second terminal T2, which are described later, are provided. The width direction W is a direction orthogonal or substantially orthogonal to the height direction T and the length direction L.

The laminated LC filter 100 includes the multilayer substrate 1. The multilayer substrate 1 includes a first principal surface 1A and a second principal surface 1B opposite to each other in the height direction T, a first side surface 1C and a second side surface 1D opposite to each other in the width direction W, and a first end surface 1E and a second end surface 1F opposite to each other in the length direction L.

On the first principal surface 1A of the multilayer substrate 1, the first terminal T1, the second terminal T2, two ground terminals G1 and G2, a first floating terminal F1, and a second floating terminal F2 are provided. On the first principal surface 1A, the first terminal T1 and the first floating terminal F1 are arranged in the width direction W. The ground terminal G1 and the ground terminal G2 are arranged in the width direction W. The second terminal T2 and the second floating terminal F2 are arranged in the width direction W. The set of the first terminal T1 and the first floating terminal F1, the set of the ground terminal G1 and the ground terminal G2, and the set of the second terminal T2 and the second floating terminal F2 are arranged in the length direction L.

The multilayer substrate 1 includes a plurality of laminated base material layers 1a to 1q. The multilayer substrate (base material layers 1a to 1q) can be made of low temperature co-fired ceramics, for example. However, the material of the multilayer substrate 1 is not limited to low temperature co-fired ceramics and may be other types of ceramics, resin, or the like, for example.

Now, the configurations of the base material layers 1a to 1q are described.

On the lower principal surface (first principal surface 1A) of the base material layer 1a, as described above, the first terminal T1, the second terminal T2, the two ground terminals G1 and G2, the first floating terminal F1, and the second floating terminal F2 are provided. Note that, in FIG. 2, for convenience of illustration, the first terminal T1, the second terminal T2, the ground terminals G1 and G2, the first floating terminal F1, and the second floating terminal F2 are separated from the base material layer 1a and indicated by the dashed lines.

Via electrodes 2a, 2b, 2c, 2d, 2e, and 2f extend through both of the principal surfaces of the base material layer 1a.

The via electrodes 2a, 2b, 2c, 2d, 2e, and 2f extend through both the principal surfaces of the base material layer 1b.

Line electrodes 3a, 3b, and 3c are provided on the upper principal surface of the base material layer 1c.

The via electrodes 2a, 2b, 2e, and 2f extend through both of the principal surfaces of the base material layer 1c.

Line electrodes 3d, 3e, and 3f are provided on the upper principal surface of the base material layer 1d.

The via electrodes 2a, 2b, 2e, and 2f and other via electrodes 2g, 2h, and 2i extend through both of the principal surfaces of the base material layer 1d.

A line electrode 3g is provided on the upper principal surface of the base material layer 1e.

The via electrodes 2g, 2h, and 2i extend through both of the principal surfaces of the base material layer 1e.

Capacitor electrodes 4a and 4b are provided on the upper principal surface of the base material layer 1f. The capacitor electrode 4a and the capacitor electrode 4b are connected to each other.

The via electrodes 2g and 2h and another via electrode 2j extend through both of the principal surfaces of the base material layer 1f.

Capacitor electrodes 4c and 4d are provided on the upper principal surface of the base material layer 1g.

The via electrodes 2g, 2h, and 2j extend through both of the principal surfaces of the base material layer 1g.

Capacitor electrodes 4e and 4f are provided on the upper principal surface of the base material layer 1h.

The via electrode 2j extends through both of the principal surfaces of the base material layer 1h.

Line electrodes 3h and 3i are provided on the upper principal surface of the base material layer 1i.

The via electrode 2j and other via electrodes 2k and 2l extend through both of the principal surfaces of the base material layer 1i.

Line electrodes 3j and 3k are provided on the upper principal surface of the base material layer 1j.

The via electrodes 2j, 2k, and 2l and other via electrodes 2m and 2n extend through both of the principal surfaces of the base material layer 1j.

Line electrodes 3l and 3m are provided on the upper principal surface of the base material layer 1k.

The via electrodes 2j, 2m, and 2n extend through both of the principal surfaces of the base material layer 1k.

Line electrodes 3n and 3o are provided on the upper principal surface of the base material layer 1l.

The via electrodes 2j, 2m, and 2n and other via electrodes 2o and 2p extend through both of the principal surfaces of the base material layer 1l.

Line electrodes 3p and 3q are provided on the upper principal surface of the base material layer 1m.

The via electrodes 2j, 2o, and 2p extend through both of the principal surfaces of the base material layer 1m.

Line electrodes 3r and 3s are provided on the upper principal surface of the base material layer 1n.

The via electrodes 2j, 2o, and 2p and other via electrodes 2q and 2r extend through both of the principal surfaces of the base material layer 1n.

The via electrodes 2j, 2q, and 2r extend through both of the principal surfaces of the base material layer 1o.

A shield electrode 5 is provided on the upper principal surface of the base material layer 1p.

The via electrodes 2j, 2q, and 2r extend through both of the principal surfaces of the base material layer 1p.

The base material layer 1q is a protective layer and does not have an electrode provided thereon.

The first terminal T1, the second terminal T2, the ground terminals G1 and G2, the first floating terminal F1, the second floating terminal F2, the via electrodes 2a to 2r, the line electrodes 3a to 3s, the capacitor electrodes 4a to 4f, and the shield electrode 5 can be made of any material and may include, as main components, copper, silver, aluminum, or the like or alloys of those metals, for example. Note that plating layers may be provided on the surfaces of the first terminal T1, the second terminal T2, the ground terminals G1 and G2, the first floating terminal F1, and the second floating terminal F2.

The laminated LC filter 100 can be manufactured by, for example, a manufacturing method hitherto used for manufacturing laminated LC filters.

Next, the connection relationships of the first terminal T1, the second terminal T2, the ground terminals G1 and G2, the first floating terminal F1, the second floating terminal F2, the via electrodes 2a to 2r, the line electrodes 3a to 3s, the capacitor electrodes 4a to 4f, and the shield electrode 5 in the laminated LC filter 100 are described.

The first terminal T1 is connected to one ends of the line electrode 3a and the line electrode 3d by the via electrode 2a.

The other ends of the line electrode 3a and the line electrode 3d are connected to the capacitor electrode 4c by the via electrode 2g.

The capacitor electrode 4e is connected to one ends of the line electrode 3h and the line electrode 3j by the via electrode 2k.

The other ends of the line electrode 3h and the line electrode 3j are connected to one ends of the line electrode 3l and the line electrode 3n by the via electrode 2m.

The other ends of the line electrode 3l and the line electrode 3n are connected to one ends of the line electrode 3p and the line electrode 3r by the via electrode 2o.

The other ends of the line electrode 3p and the line electrode 3r are connected to the shield electrode 5 by the via electrode 2q.

The second terminal T2 is connected to one ends of the line electrode 3b and the line electrode 3e by the via electrode 2b.

The other ends of the line electrode 3b and the line electrode 3e are connected to the capacitor electrode 4d by the via electrode 2h.

The capacitor electrode 4f is connected to one ends of the line electrode 3i and the line electrode 3k by the via electrode 2l.

The other ends of the line electrode 3i and the line electrode 3k are connected to one ends of the line electrode 3m and the line electrode 3o by the via electrode 2n.

The other ends of the line electrode 3m and the line electrode 3o are connected to one ends of the line electrode 3q and the line electrode 3s by the via electrode 2p.

The other ends of the line electrode 3q and the line electrode 3s are connected to the shield electrode 5 by the via electrode 2r.

The shield electrode 5 is connected to one end of the line electrode 3g by the via electrode 2j.

The other end of the line electrode 3g is connected to the middle portions of the line electrode 3f and the line electrode 3c by the via electrode 2i.

One ends of the line electrode 3f and the line electrode 3c are connected to the ground terminal G1 by the via electrode 2e.

The other ends of the line electrode 3f and the line electrode 3c are connected to the ground terminal G2 by the via electrode 2f.

The first floating terminal F1 is connected to the via electrode 2c. The via electrode 2c is connected to no electrode and the like except for the first floating terminal F1.

The second floating terminal F2 is connected to the via electrode 2d. The via electrode 2d is connected to no electrode and the like except for the second floating terminal F2.

The laminated LC filter 100 having the structure described above defines a high pass filter including an equivalent circuit illustrated in FIG. 3.

The laminated LC filter 100 includes the first terminal T1, the second terminal T2, and the ground terminals G1 and G2. A signal line 6 is provided between the first terminal T1 and the second terminal T2. The ground terminals G1 and G2 are connected to the ground.

A third capacitor C3 is connected in the middle of the signal line 6.

One end of a first capacitor C1 is connected to a point on the signal line 6 between the first terminal T1 and the third capacitor C3. The node between the first capacitor C1 and the signal line 6 is referred to as first node P1. One end of a first inductor L1 is connected to the other end of the first capacitor C1.

One end of a second capacitor C2 is connected to a point on the signal line 6 between the third capacitor C3 and the second terminal T2. The node between the second capacitor C2 and the signal line 6 is referred to as second node P2. One end of a second inductor L2 is connected to the other end of the second capacitor C2.

The laminated LC filter 100 includes, as described above, the shield electrode 5 inside the multilayer substrate 1. In the equivalent circuit diagram of FIG. 3, the position of the shield electrode 5 in the equivalent circuit is indicated by reference numeral 5.

The other end of the first capacitor C1 and the other end of the second capacitor C2 are connected to the shield electrode 5.

The shield electrode 5 is connected to the ground terminals G1 and G2 with a third inductor L3 interposed therebetween. As described above, the ground terminals G1 and G2 are connected to the ground.

A fourth inductor L4 is connected between the first terminal T1 and the first node P1.

A fifth inductor L5 is connected between the second node P2 and the second terminal T2.

Next, the relationship between the structure of the laminated LC filter 100 illustrated in FIG. 2 and the equivalent circuit of the laminated LC filter 100 illustrated in FIG. 3 is described. For example, to enhance Q, the laminated LC filter 100 may include an inductor including a plurality of stacked line electrodes and connecting the line electrodes in parallel to each other by via electrodes.

The fourth inductor L4 including the via electrode 2a, the line electrode 3a, the line electrode 3d, and the via electrode 2g is connected between the first terminal T1 and the capacitor electrode 4c. With respect to the fourth inductor L4, the via electrode 2a may be referred to as first portion, the line electrode 3a and the line electrode 3d may be referred to as second portion, and the via electrode 2g may be referred to as third portion.

The node between the via electrode 2g and the capacitor electrode 4c corresponds to the first node P1.

The fifth inductor L5 including the via electrode 2b, the line electrode 3b, the line electrode 3e, and the via electrode 2h is connected between the second terminal T2 and the capacitor electrode 4d. With respect to the fifth inductor L5, the via electrode 2b may be referred to as fourth portion, the line electrode 3b and the line electrode 3e may be referred to as fifth portion, and the via electrode 2h may be referred to as sixth portion.

The node between the via electrode 2h and the capacitor electrode 4d corresponds to the second node P2.

As described above, the capacitor electrode 4a and the capacitor electrode 4b are connected to each other.

The capacitor defined by the capacitance generated between the capacitor electrode 4c and the capacitor electrode 4a and the capacitor defined by the capacitance generated between the capacitor electrode 4b and the capacitor electrode 4d are connected to each other in series, to thus define the third capacitor C3.

In this way, the first terminal T1, the fourth inductor L4, the first node P1, the third capacitor C3, the second node P2, the fifth inductor L5, and the second terminal T2 are connected in this order, to thus define the signal line 6.

The capacitance generated between the capacitor electrode 4c and the capacitor electrode 4e defines the first capacitor C1.

The first inductor L1 is defined by the via electrode 2k, the line electrode 3h, the line electrode 3j, the via electrode 2m, the line electrode 3l, the line electrode 3n, the via electrode 2o, the line electrode 3p, the line electrode 3r, and the via electrode 2q that connect the capacitor electrode 4e and the shield electrode 5 to each other. With respect to the first inductor L1, the node between the capacitor electrode 4e and the via electrode 2k defines and functions as the end portion on the signal line 6 side, and the node between the via electrode 2q and the shield electrode 5 defines and functions as the end portion on the ground terminals G1 and G2 side.

In this way, the first capacitor C1 and the first inductor L1 are connected in series in this order between the first node P1 and the shield electrode 5.

The capacitance generated between the capacitor electrode 4d and the capacitor electrode 4f defines the second capacitor C2.

The second inductor L2 is defined by the via electrode 2l, the line electrode 3i, the line electrode 3k, the via electrode 2n, the line electrode 3m, the line electrode 3o, the via electrode 2p, the line electrode 3q, the line electrode 3s, and the via electrode 2r that connect the capacitor electrode 4f and the shield electrode 5 to each other. With respect to the second inductor L2, the node between the capacitor electrode 4f and the via electrode 2l defines and functions as the end portion on the signal line 6 side, and the node between the via electrode 2r and the shield electrode 5 defines and functions as the end portion on the ground terminals G1 and G2 side.

In this way, the second capacitor C2 and the second inductor L2 are connected in series in this order between the second node P2 and the shield electrode 5.

The third inductor L3 is defined by the via electrode 2j, the line electrode 3g, the via electrode 2i, the line electrode 3f, the line electrode 3c, the via electrode 2e, and the via electrode 2f that connect the shield electrode 5 and the ground terminals G1 and G2 to each other.

As described above, with the structure of the laminated LC filter 100 illustrated in FIG. 2, the equivalent circuit of the laminated LC filter 100 illustrated in FIG. 3 is provided.

In the laminated LC filter 100 according to the present preferred embodiment with the structure and equivalent circuit described above, the stray capacitance generated between the end portion on the signal line 6 side of the first inductor L1 and the shield electrode 5 and the stray capacitance generated between the end portion on the signal line 6 side of the second inductor L2 and the shield electrode 5 are reduced.

That is, in the laminated LC filter 100, the via electrode 2q defining and functioning as the end portion on the ground terminals G1 and G2 side of the first inductor L1 is connected to the shield electrode 5. Further, the end portion on the signal line 6 side of the first inductor L1 (node between the capacitor electrode 4e and the via electrode 2k) is closer to the first principal surface 1A than the end portion on the ground terminals G1 and G2 side of the first inductor L1 (node between the via electrode 2q and the shield electrode 5) is in the lamination direction of the base material layers 1a to 1q. Further, in the laminated LC filter 100, the via electrode 2r defining and functioning as the end portion on the ground terminals G1 and G2 side of the second inductor L2 is connected to the shield electrode 5. Further, the end portion on the signal line 6 side of the second inductor L2 (node between the capacitor electrode 4f and the via electrode 2l) is closer to the first principal surface 1A than the end portion on the ground terminals G1 and G2 side of the second inductor L2 (node between the via electrode 2r and the shield electrode 5) is in the lamination direction of the base material layers 1a to 1q. Thus, in the laminated LC filter 100, the stray capacitance generated between the end portion on the signal line 6 side of the first inductor L1 and the shield electrode 5, which is in parallel to the first inductor L1, and the stray capacitance generated between the end portion on the signal line 6 side of the second inductor L2 and the shield electrode 5, which is in parallel to the second inductor L2, are reduced.

As a result, the pass band of the laminated LC filter 100 is prevented from being narrowed. Further, the return loss of the laminated LC filter 100 is reduced. In addition, the insertion loss of the laminated LC filter 100 is also reduced due to a reduction in return loss.

Further, in the laminated LC filter 100, the fourth inductor L4 is connected between the first terminal T1 and the first node P1 and the fifth inductor L5 is connected between the second terminal T2 and the second node P2 so that the impedance is increased and the return loss is reduced.

Further, in the laminated LC filter 100, the fourth inductor L4 and the fifth inductor L5 are connected so that the second pole of the return loss is positioned on the high frequency side, and thus the areas of the capacitor electrodes 4a and 4b of the third capacitor C3, which is a capacitor to provide impedance adjustment, can be reduced. Thus, in the laminated LC filter 100, the capacitor electrodes 4a and 4b of the third capacitor C3 can be configured in a shape elongated in the length direction L so that the air-core diameters of the first inductor L1 and the second inductor L2 are prevented from being blocked by the capacitor electrodes 4a and 4b, with the result that an increase in insertion loss is prevented.

Further, in the laminated LC filter 100, the areas of the first terminal T1 and the second terminal T2 are reduced so that the stray capacitance generated between the ground such as the substrate on which the laminated LC filter 100 has been mounted and the first terminal T1 and the stray capacitance generated between the ground and the second terminal T2 are reduced. As a result, the pass band of the laminated LC filter 100 is widened and the return loss is reduced. Note that, in the laminated LC filter 100, the areas of the first terminal T1 and the second terminal T2 are small, but the first floating terminal F1 and the second floating terminal F2 are provided on the first principal surface 1A so that the mounting strength of the laminated LC filter 100 with respect to the substrate or the like is not degraded.

Further, in the laminated LC filter 100, although no electrical connection is made, since the first floating terminal F1 is connected to the via electrode 2c and the second floating terminal F2 is connected to the via electrode 2d, the anchoring effect is generated so that the strength of the connection between the first floating terminal F1 and the multilayer substrate 1 and the strength of the connection between the second floating terminal F2 and the multilayer substrate 1 are improved.

Experiment

To confirm the effectiveness of preferred embodiments of the present invention, the following experiment was conducted.

First, as an example, the laminated LC filter 100 according to the preferred embodiment described above was manufactured.

Figure 4:
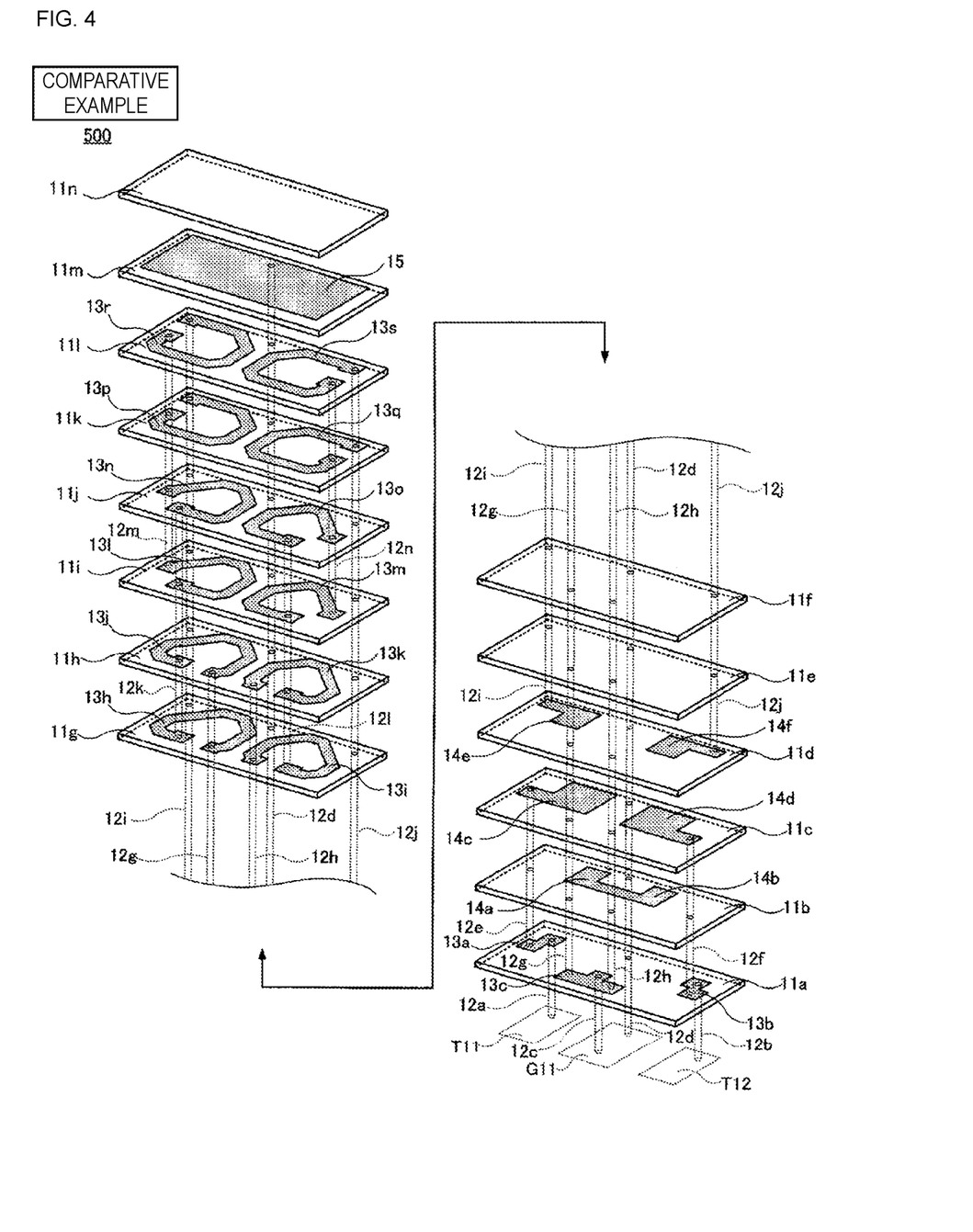
FIG. 4 is an exploded perspective view of a laminated LC filter 500 according to a comparative example.
Figure 5:
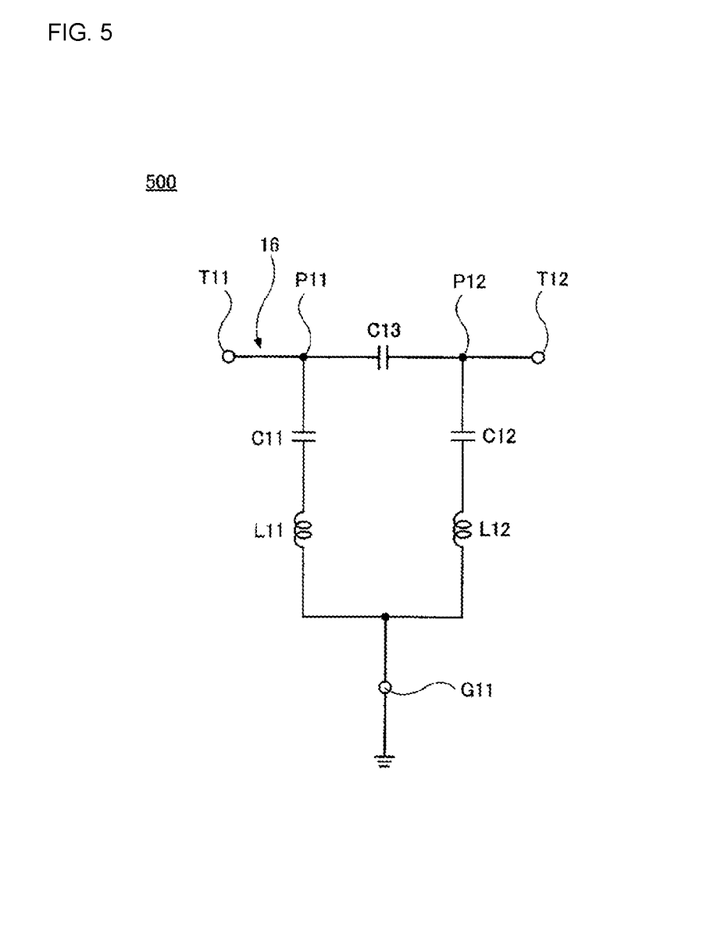
FIG. 5 is an equivalent circuit diagram of the laminated LC filter 500.

Further, for comparison, a laminated LC filter 500 according to a comparative example, which is illustrated in FIG. 4 and FIG. 5, was manufactured. Here, FIG. 4 is an exploded perspective view of the laminated LC filter 500. FIG. 5 is an equivalent circuit diagram of the laminated LC filter 500.

The laminated LC filter 500 according to the comparative example had a configuration partially different from that of the laminated LC filter 100 according to the example.

The laminated LC filter 500 includes a multilayer substrate including laminated base material layers 11a to 11n.

A first terminal T11, a second terminal T12, and a ground terminal G11 are provided on the lower principal surface of the base material layer 11a.

Line electrodes 13a, 13b, and 13c are provided on the upper principal surface of the base material layer 11a.

Via electrodes 12a, 12b, 12c, and 12d extend through both of the principal surfaces of the base material layer 11a.

Capacitor electrodes 14a and 14b are provided on the upper principal surface of the base material layer 11b. The capacitor electrode 14a and the capacitor electrode 14b are connected to each other.

The via electrode 12d and other via electrodes 12e, 12f, 12g, and 12h extend through both of the principal surfaces of the base material layer 11b.

Capacitor electrodes 14c and 14d are provided on the upper principal surface of the base material layer 11c.

The via electrodes 12d, 12e, 12f, 12g, and 12h extend through both of the principal surfaces of the base material layer 11c.

Capacitor electrodes 14e and 14f are provided on the upper principal surface of the base material layer 11d.

The via electrodes 12d, 12g, and 12h extend through both of the principal surfaces of the base material layer 11d.

The via electrodes 12d, 12g, and 12h and other via electrodes 12i and 12j extend through both of the principal surfaces of the base material layer 11e.

The via electrodes 12d, 12g, 12h, 12i, and 12j extend through both of the principal surfaces of the base material layer 11f.

Line electrodes 13h and 13i are provided on the upper principal surface of the base material layer 11g.

The via electrodes 12d, 12g, 12h, 12i, and 12j extend through both of the principal surfaces of the base material layer 11g.

Line electrodes 13j and 13k are provided on the upper principal surface of the base material layer 11h.

The via electrodes 12d, 12g, 12h, 12i, and 12j and other via electrodes 12k and 12l extend through both of the principal surfaces of the base material layer 11h.

Line electrodes 13l and 13m are provided on the upper principal surface of the base material layer 11i.

The via electrodes 12d, 12i, 12j, 12k, and 12i extend through both of the principal surfaces of the base material layer 11i.

Line electrodes 13n and 13o are provided on the upper principal surface of the base material layer 11j.

The via electrodes 12d, 12i, 12j, 12k, and 12l and other via electrodes 12m and 12n extend through both of the principal surfaces of the base material layer 11j.

Line electrodes 13p and 13q are formed on the upper principal surface of the base material layer 11k.

The above-mentioned via electrodes 12d, 12i, 12j, 12m, and 12n are formed through both the principal surfaces of the base material layer 11k.

Line electrodes 13r and 13s are provided on the upper principal surface of the base material layer 11l.

The via electrodes 12d, 12i, 12j, 12m, and 12n extend through both of the principal surfaces of the base material layer 11l.

A shield electrode 15 is provided on the upper principal surface of the base material layer 11m.

The base material layer 11n is a protective layer and includes no electrodes thereon.

Next, the connection relationships of the first terminal T11, the second terminal T12, the ground terminal G11, the via electrodes 12a to 12n, the line electrodes 13a to 13s, the capacitor electrodes 14a to 14f, and the shield electrode 15 in the laminated LC filter 500 according to the comparative example are described.

The first terminal T11 is connected to one end of the line electrode 13a by the via electrode 12a.

The other end of the line electrode 13a is connected to the capacitor electrode 14c by the via electrode 12e.

The capacitor electrode 14e is connected to one ends of the line electrode 13r and the line electrode 13p by the via electrode 12i.

The other ends of the line electrode 13r and the line electrode 13p are connected to one ends of the line electrode 13n and the line electrode 13l by the via electrode 12m.

The other ends of the line electrode 13n and the line electrode 13l are connected to one ends of the line electrode 13j and the line electrode 13h by the via electrode 12k.

The other ends of the line electrode 13j and the line electrode 13h are connected to one end of the line electrode 13c by the via electrode 12g.

The second terminal T12 is connected to one end of the line electrode 13b by the via electrode 12b.

The other end of the line electrode 13b is connected to the capacitor electrode 14d by the via electrode 12f.

The capacitor electrode 14f is connected to one ends of the line electrode 13s and the line electrode 13q by the via electrode 12j.

The other ends of the line electrode 13s and the line electrode 13q are connected to one ends of the line electrode 13o and the line electrode 13m by the via electrode 12n.

The other ends of the line electrode 13o and the line electrode 13m are connected to one ends of the line electrode 13k and the line electrode 13i by the via electrode 12l.

The other ends of the line electrode 13k and the line electrode 13i are connected to the other end of the line electrode 13c by the via electrode 12h.

A central portion of the line electrode 13c is connected to the ground terminal G11 by the via electrode 12c.

The shield electrode 15 is connected to the ground terminal G11 by the via electrode 12d.

In the laminated LC filter 500 according to the comparative example, the capacitor defined by the capacitance generated between the capacitor electrode 14c and the capacitor electrode 14a and the capacitor defined by the capacitance generated between the capacitor electrode 14b and the capacitor electrode 14d are connected to each other in series, to thus define a third capacitor C13.

The capacitance generated between the capacitor electrode 14c and the capacitor electrode 14e defines the first capacitor C11.

A first inductor L11 is defined by the via electrode 12i, the line electrode 13r, the line electrode 13p, the via electrode 12m, the line electrode 13n, the line electrode 13l, the via electrode 12k, the line electrode 13j, the line electrode 13h, the via electrode 12g, the line electrode 13c, and the via electrode 12c that connect the capacitor electrode 14e and the ground terminal G11 to each other. With respect to the first inductor L11, the node between the capacitor electrode 14e and the via electrode 12i defines and functions as the end portion on the signal line 16 side, and the node between the via electrode 12c and the ground terminal G11 defines and functions as the end portion on the ground terminal G11 side.

The capacitance generated between the capacitor electrode 14d and the capacitor electrode 14f defines a second capacitor C12.

A second inductor L12 is defined by the via electrode 12j, the line electrode 13s, the line electrode 13q, the via electrode 12n, the line electrode 13o, the line electrode 13m, the via electrode 12l, the line electrode 13k, the line electrode 13i, the via electrode 12h, the line electrode 13c, and the via electrode 12c that connect the capacitor electrode 14f and the ground terminal G11 to each other. With respect to the second inductor L12, the node between the capacitor electrode 14f and the via electrode 12j defines and functions as the end portion on the signal line 16 side, and the node between the via electrode 12c and the ground terminal G11 defines and functions as the end portion on the ground terminal G11 side.

In the laminated LC filter 500 according to the comparative example, as illustrated in FIG. 5, the first terminal T11, a first node P11, the third capacitor C13, a second node P12, and the second terminal T12 are connected to the signal line 16 in this order. Further, a first capacitor C11 and the first inductor L11 are connected in this order between the first node P11 and the ground terminal G11. The second capacitor C12 and the second inductor L12 are connected in this order between the second node P12 and the ground terminal G11. Note that, in the laminated LC filter 500 according to the comparative example, the fourth inductor L4 and the fifth inductor L5, which are included in the laminated LC filter 100, are removed.

In the laminated LC filter 500, as described above, the node between the capacitor electrode 14e and the via electrode 12i corresponds to the end portion on the signal line 16 side of the first inductor L11. In the laminated LC filter 500, the line electrode 13r, which is connected to the end portion on the signal line 16 side of the first inductor L11 by the via electrode 12i and has a potential close to that at the end portion on the signal line 16 side of the first inductor L11, is located near the shield electrode 15, which is connected to the ground terminal G11, in terms of distance, with the result that large stray capacitance is likely to be generated between the line electrode 13r and the shield electrode 15. That is, in the laminated LC filter 500, large stray capacitance is likely to be generated in parallel to the first inductor L11.

Further, in the laminated LC filter 500, as described above, the node between the capacitor electrode 14f and the via electrode 12j corresponds to the end portion on the signal line 16 side of the second inductor L12. In the laminated LC filter 500, the line electrode 13s, which is connected to the end portion on the signal line 16 side of the second inductor L12 by the via electrode 12j and has a potential close to that at the end portion on the signal line 16 side of the second inductor L12, is located near the shield electrode 15, which is connected to the ground terminal G11, in terms of distance, with the result that large stray capacitance is likely to be generated between the line electrode 13s and the shield electrode 15. That is, in the laminated LC filter 500, large stray capacitance is likely to be generated in parallel to the second inductor L12.

Figure 6:
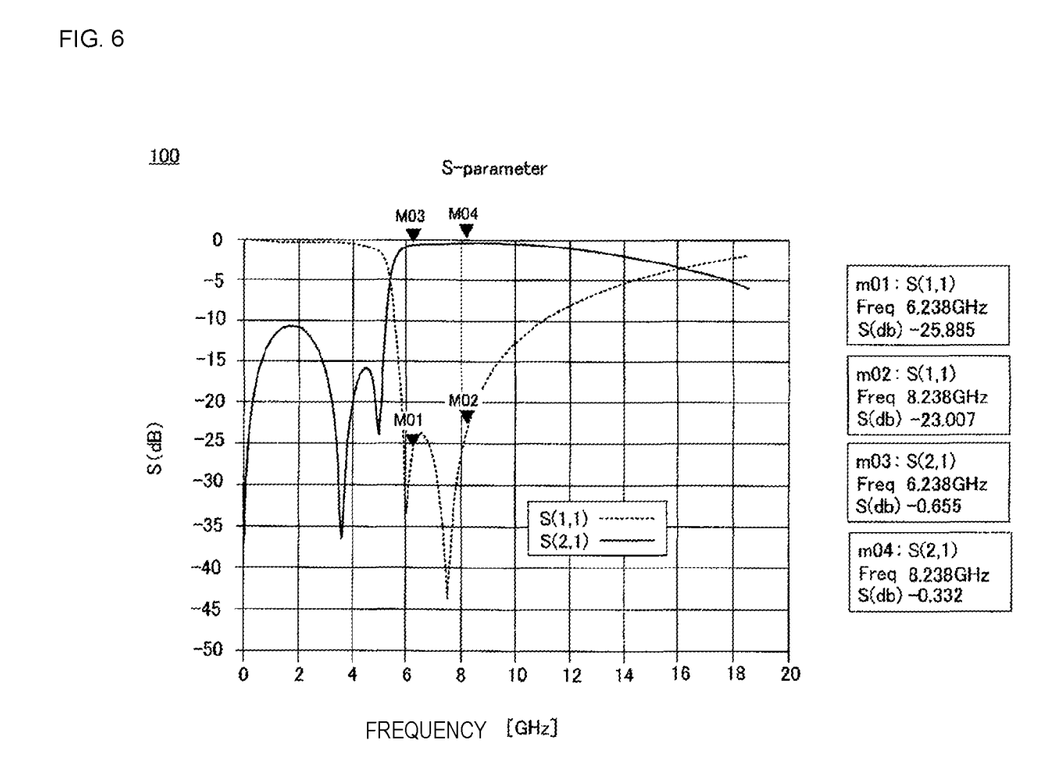
FIG. 6 is a characteristic diagram of the laminated LC filter 100.
Figure 7:
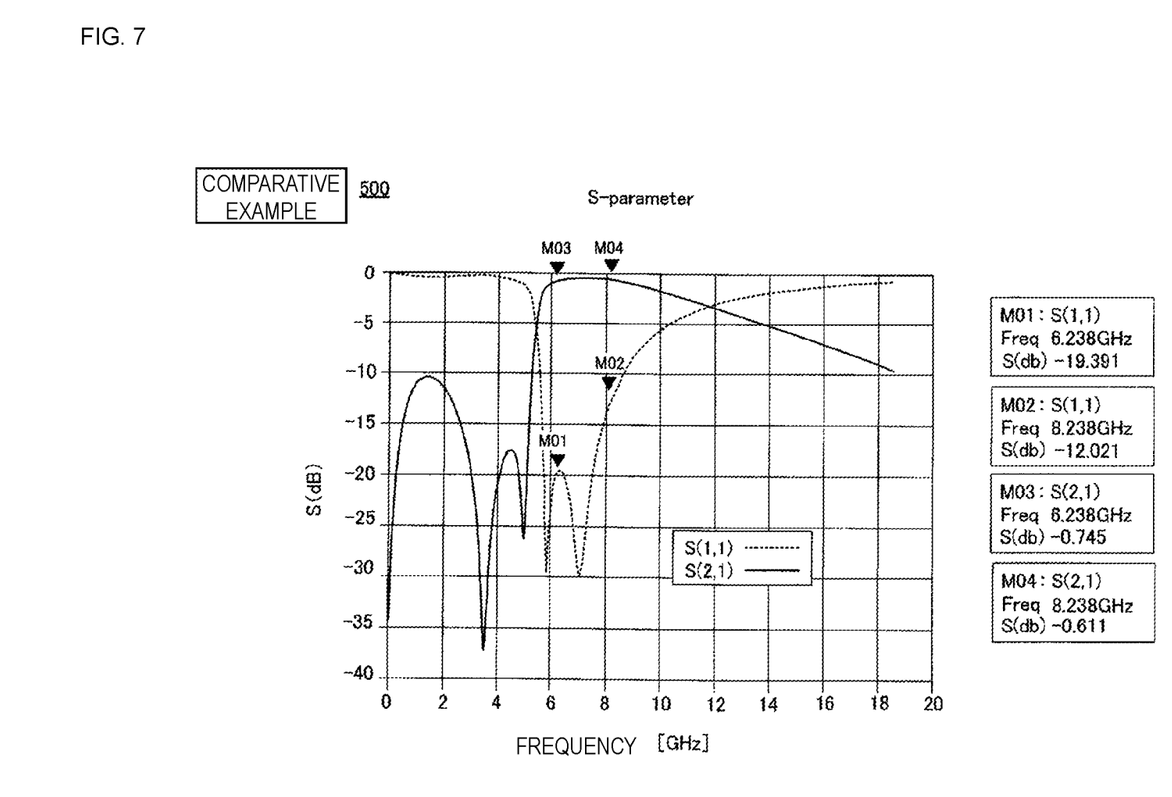
FIG. 7 is a characteristic diagram of the laminated LC filter 500.

The S(1, 1) characteristics and S(2, 1) characteristics of the laminated LC filter 100 according to the example of a preferred embodiment of the present invention are illustrated in FIG. 6. Here, the first terminal T1 is a first terminal and the second terminal T2 is a second terminal. Further, the S(1, 1) characteristics and S(2, 1) characteristics of the laminated LC filter 500 according to the comparative example are illustrated in FIG. 7. Here, the first terminal T11 is a first terminal and the second terminal T12 is a second terminal.

As is clear from a comparison of FIG. 6 and FIG. 7 to each other, the laminated LC filter 100 according to the example has a wider pass band than the laminated LC filter 500 according to the comparative example. Further, the laminated LC filter 100 according to the example has a smaller return loss than the laminated LC filter 500 according to the comparative example. Specifically, while the return loss of the laminated LC filter 500 at M02 is approximately −12 dB, the return loss of the laminated LC filter 100 at M02 is reduced and approximately −23 dB.

From the above, the effectiveness of preferred embodiments of the present invention was able to be confirmed.

In the above, the laminated LC filters 100 according to the preferred embodiments of the present invention have been described. However, the laminated LC filters of preferred embodiments of the present invention are not limited to the detailed description above and may be variously modified within the gist of the invention.

For example, in the laminated LC filter 100, the shield electrode 5 is provided between the base material layer 1p and the base material layer 1q of the multilayer substrate 1, but instead, the shield electrode 5 may be provided on the second principal surface 1B of the multilayer substrate 1.

A laminated LC filter according to a preferred embodiment of the present invention is described in the "Summary of the Invention" section.

It is also preferable that this laminated LC filter defines a high pass filter, for example.

Further, it is also preferable that the first inductor and the second inductor are each defined by the line electrode and the via electrode, and the third inductor is defined mainly by the via electrode. When the first inductor and the second inductor include the line electrodes, a large stray capacitance is likely to be generated particularly between the first inductor and the shield electrode and between the second inductor and the shield electrode. In preferred embodiments of the present invention, however, the generation of stray capacitance at those portions is prevented. Note that the phrase "the third inductor is defined mainly by the via electrode" means that 50% or more of the inductance of the third inductor is defined by the via electrode.

Further, it is also preferable that, when a point on the signal line to which the first capacitor is connected is a first node and a point on the signal line to which the second capacitor is connected is a second node, a fourth inductor is provided between the first terminal and the first node and a fifth inductor is provided between the second node and the second terminal. In this case, the impedance can be increased and the return loss can be reduced.

Further, in this case, it is also preferable that the multilayer substrate has a rectangular or substantially rectangular parallelepiped shape with a width direction, a length direction, and a height direction, the fourth inductor includes a first portion that includes the via electrode that has one end connected to the first terminal and extends toward the second principal surface, a second portion that includes the line electrode that has one end connected to another end of the first portion and another end apart from the one end in question by a certain distance in the width direction, and a third portion that includes the via electrode that has one end connected to the another end of the second portion and extends toward the second principal surface; and the fifth inductor includes a fourth portion that includes the via electrode that has one end connected to the second terminal and extends toward the second principal surface, a fifth portion that includes the line electrode that has one end connected to another end of the fourth portion and another end apart from the one end in question by a certain distance in the width direction, and a sixth portion that includes the via electrode that has one end connected to the another end of the fifth portion and extends toward the second principal surface. In this case, the volume of the multilayer substrate is effectively utilized so that the inductance value of the fourth inductor and the inductance value of the fifth inductor can be increased.

Further, it is also preferable that the multilayer substrate has a rectangular or substantially rectangular parallelepiped shape with a width direction, a length direction, and a height direction, and includes, on the first principal surface, a first floating terminal arranged with the first terminal in the width direction, and a second floating terminal arranged with the second terminal in the width direction. In this case, the areas of the first terminal and the second terminal can be reduced without a degradation in mounting strength of the laminated LC filter with respect to the substrate or the like, and the stray capacitance generated between the ground such as the substrate on which the laminated LC filter has been mounted and the first terminal and the stray capacitance generated between the ground and the second terminal can be reduced. Moreover, the pass band of the mounted laminated LC filter can be prevented from being narrowed and the return loss can be reduced.

Further, it is also preferable that the first floating terminal is connected to the via electrode, and the via electrode is connected to no electrode inside the multilayer substrate except for the first floating terminal, and the second floating terminal is connected to the via electrode, and the via electrode is connected to no electrode inside the multilayer substrate except for the second floating terminal. In this case, the first floating terminal and the second floating terminal are affected by the anchoring effect due to the via electrode so that the strength of the connection between the first floating terminal and the multilayer substrate and the strength of the connection between the second floating terminal and the multilayer substrate are improved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated LC filter comprising:
   a multilayer substrate including a plurality of laminated base material layers, a first principal surface, and a second principal surface;
   at least one via electrode extending through the plurality of laminated base material layers;
   at least one line electrode and a capacitor electrode between the plurality of base material layers; and
   a first terminal, a second terminal, and a ground terminal that are on the first principal surface of the multilayer substrate; wherein
   at least one of the at least one via electrode and the at least one line electrode defines an inductor;
   the capacitor electrode defines a capacitor;
   a signal line is between the first terminal and the second terminal;
   a third capacitor is connected in a central portion of the signal line;
   a first capacitor and a first inductor are connected in series in this order between the ground terminal and a location on the signal line between the first terminal and the third capacitor;
   a second capacitor and a second inductor are connected in series in this order between the ground terminal and a location on the signal line between the third capacitor and the second terminal;
   the laminated LC filter further includes:
     a shield electrode between the plurality of base material layers adjacent to or in a vicinity of the second principal surface of the multilayer substrate or on the second principal surface of the multilayer substrate; and
     a third inductor connected between the shield electrode and the ground terminal; and
   in the multilayer substrate:
     an end portion on a ground terminal side of the first inductor is connected to the shield electrode;
     the end portion on the signal line side of the first inductor is closer to the first principal surface than the end portion on the ground terminal side of the first inductor is in a lamination direction of the plurality of laminated base material layers,
     an end portion on a ground terminal side of the second inductor is connected to the shield electrode; and
     the end portion on the signal line side of the second inductor is closer to the first principal surface than the end portion on the ground terminal side of the second inductor is in the lamination direction of the plurality of laminated base material layers.

2. The laminated LC filter according to claim 1, wherein the laminated LC filter defines a high pass filter.

3. The laminated LC filter according to claim 1, wherein
the first inductor and the second inductor are each defined by the at least one line electrode and the at least one via electrode; and
the third inductor is defined mainly by the at least one via electrode.

4. The laminated LC filter according to claim 1, wherein when a location on the signal line to which the first capacitor is connected is a first node and a location on the signal line to which the second capacitor is connected is a second node, a fourth inductor is provided between the first terminal and the first node, and a fifth inductor is provided between the second node and the second terminal.

5. The laminated LC filter according to claim 4, wherein
the multilayer substrate has a rectangular or substantially rectangular parallelepiped shape with a width direction, a length direction, and a height direction;
the fourth inductor includes:
a first portion including the at least one via electrode with one end connected to the first terminal and extending toward the second principal surface;
a second portion including the at least one line electrode with one end connected to another end of the first portion and another end apart from the one end by a certain distance in the width direction; and
a third portion including the at least one via electrode with one end connected to the another end of the second portion and extending toward the second principal surface; and
the fifth inductor includes:
a fourth portion including the at least one via electrode with one end connected to the second terminal and extending toward the second principal surface;
a fifth portion including the at least one line electrode with one end connected to another end of the fourth portion and another end apart from the one end by a certain distance in the width direction; and
a sixth portion including the at least one via electrode with one end connected to the another end of the fifth portion and extending toward the second principal surface.

6. The laminated LC filter according to claim 1, wherein
the multilayer substrate has a rectangular or substantially rectangular parallelepiped shape with a width direction, a length direction, and a height direction, and includes, on the first principal surface;
a first floating terminal arranged with the first terminal in the width direction; and
a second floating terminal arranged with the second terminal in the width direction.

7. The laminated LC filter according to claim 6, wherein
the first floating terminal is connected to the at least one via electrode, and the at least one via electrode is connected to no electrode inside the multilayer substrate, except for the first floating terminal; and
the second floating terminal is connected to the at least one via electrode, and the at least one via electrode is connected to no electrode inside the multilayer substrate, except for the second floating terminal.

8. The laminated LC filter according to claim 1, wherein each of the plurality of base material layers are made of low temperature co-fired ceramics.

9. The laminated LC filter according to claim 1, wherein the capacitor electrode includes at least one of copper, silver, or aluminum, or an alloy including at least one of copper, silver, or aluminum as a main component.

10. The laminated LC filter according to claim 1, wherein the shield electrode includes at least one of copper, silver, or aluminum, or an alloy including at least one of copper, silver, or aluminum as a main component.

11. The laminated LC filter according to claim 1, wherein the at least one line electrode includes at least one of copper, silver, or aluminum, or an alloy including at least one of copper, silver, or aluminum as a main component.

* * * * *